(12) United States Patent
Lee

(10) Patent No.: US 8,304,822 B2
(45) Date of Patent: Nov. 6, 2012

(54) PIXEL FOR PICKING UP IMAGE SIGNAL AND METHOD OF MANUFACTURING THE PIXEL

(75) Inventor: Do Young Lee, Seongnam-Si (KR)

(73) Assignee: Siliconfile Technologies Inc. (KR)

( * ) Notice: Subject to any disclaimer, the term of this patent is extended or adjusted under 35 U.S.C. 154(b) by 54 days.

(21) Appl. No.: 12/377,651

(22) PCT Filed: Aug. 10, 2007

(86) PCT No.: PCT/KR2007/003836
§ 371 (c)(1),
(2), (4) Date: Feb. 16, 2009

(87) PCT Pub. No.: WO2008/020692
PCT Pub. Date: Feb. 21, 2008

(65) Prior Publication Data
US 2010/0127313 A1    May 27, 2010

(30) Foreign Application Priority Data
Aug. 16, 2006 (KR) .................. 10-2006-0076925

(51) Int. Cl.
*H01L 31/062* (2006.01)
*H01L 31/113* (2006.01)

(52) U.S. Cl. .......... 257/292; 257/46; 257/104; 257/544; 257/480; 257/E25.032; 438/979; 438/328; 438/237

(58) Field of Classification Search .......... 257/291, 257/292, 440, 443, 444, 446, 461, 463, E25.032, 257/46, 104, 121, 290, 544, 547, 656, 480; 438/66, 91, 149, 144, 983, 979, 380, 328, 438/237, 208, 220, 356, 414
See application file for complete search history.

(56) References Cited

U.S. PATENT DOCUMENTS

| 6,258,636 | B1* | 7/2001 | Johnson et al. ............... 438/149 |
| 7,102,184 | B2* | 9/2006 | Rhodes .......................... 257/292 |
| 7,411,173 | B2* | 8/2008 | Park ............................ 250/214.1 |
| 7,608,903 | B2* | 10/2009 | Mouli ............................ 257/431 |
| 2006/0023097 | A1* | 2/2006 | Watanabe ..................... 348/308 |
| 2007/0045680 | A1* | 3/2007 | Ladd et al. .................... 257/291 |
| 2008/0106625 | A1* | 5/2008 | Border et al. ................. 348/296 |

FOREIGN PATENT DOCUMENTS

| KR | 1019830001554 | 8/1983 |
| KR | 100184453 | 12/1998 |
| KR | 1020020047432 | 6/2002 |

* cited by examiner

*Primary Examiner* — Michelle Mandala
*Assistant Examiner* — Thanh Y Tran
(74) *Attorney, Agent, or Firm* — Park & Associates IP Law, P.C.

(57) ABSTRACT

Provided is a pixel for picking up an image signal capable of suppressing an occurrence of a cross-talk. The pixel for picking up an image signal includes a substrate surrounded by a trench, a photodiode, and a pass transistor. The photodiode is formed at an upper portion of the substrate and includes a P-type diffusion area and an N-type diffusion area which are joined with each other in a longitudinal direction. The pass transistor is formed at the upper portion of the substrate and includes the one terminal that is the joined P-type diffusion area and the N-type diffusion area, the other terminal that is a floating diffusion area, and a gate terminal disposed between the two terminals. The pixel for picking up an image signal is surrounded by the trench which penetrates the substrate from the upper portion to the lower portion of the substrate, and the trench is filled with an insulator.

10 Claims, 2 Drawing Sheets

[Fig. 1]
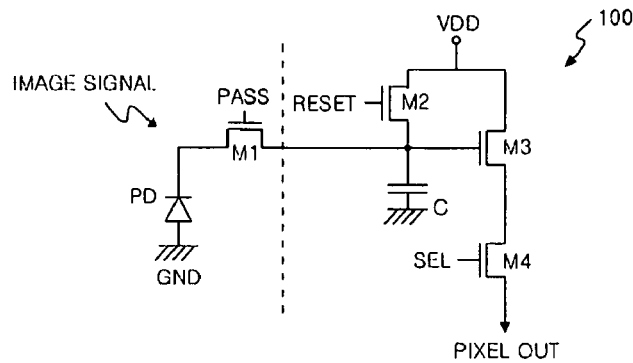
[Fig. 2]
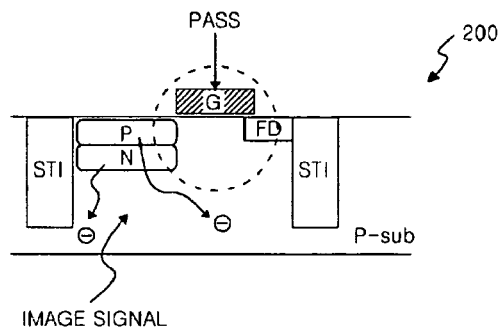
[Fig. 3]
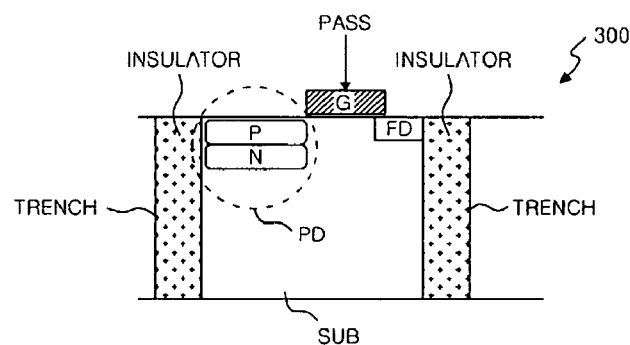
[Fig. 4]
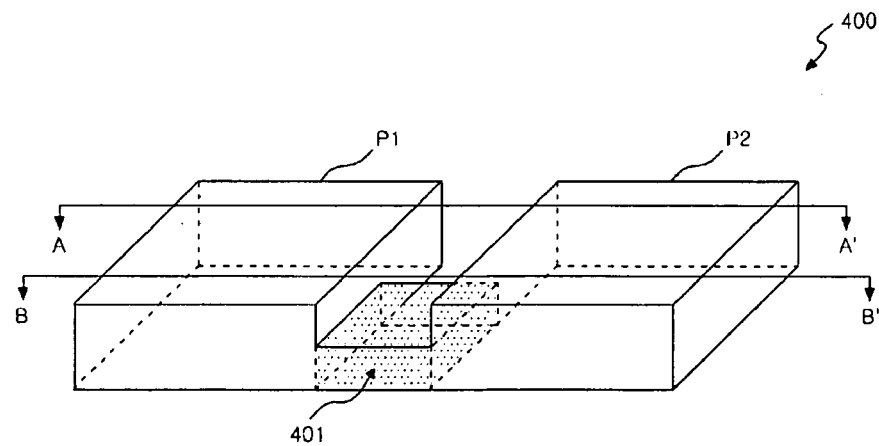

[Fig. 5]
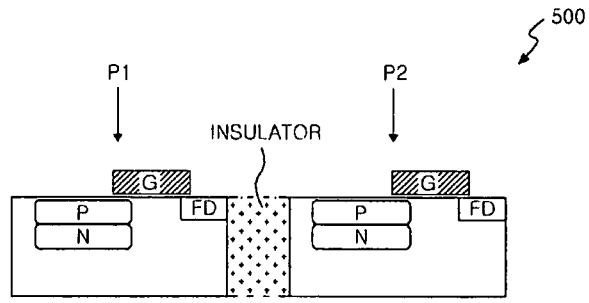
[Fig. 6]
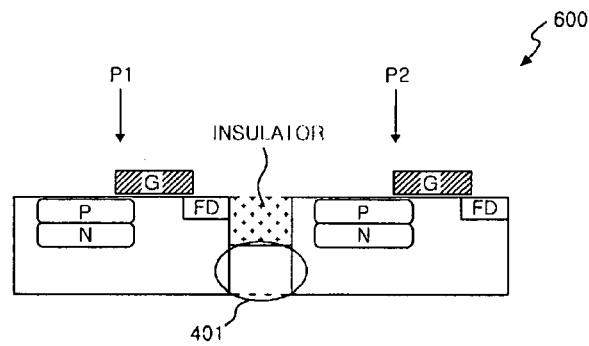
[Fig. 7]
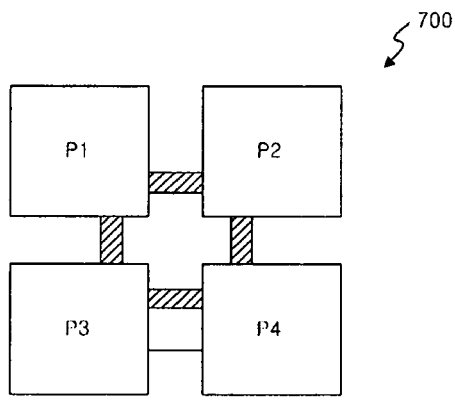
[Fig. 8]
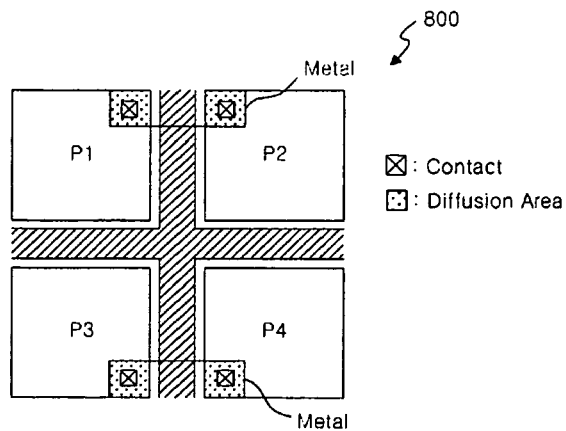

PIXEL FOR PICKING UP IMAGE SIGNAL AND METHOD OF MANUFACTURING THE PIXEL

TECHNICAL FIELD

The present invention relates to a pixel included in an image sensor, and more particularly, to a pixel structure for suppressing an occurrence of a cross-talk between pixels.

BACKGROUND ART

An image sensor includes a plurality of pixels, and each of the pixels generates an electrical signal corresponding to an image signal incident on the image sensor. Each of the pixels includes a photodiode that directly receives the image signal. As an area of the photodiode increases, the photodiode can receive the image signal more effectively. According to current trends in technology, a resolution of the electrical signal corresponding to the image signal is increased by increasing the number of pixels included in the image sensor, and a size of the image sensor is decreased. Therefore, technical means for decreasing the area of the image sensor and the area of each of the pixels have been studied.

FIG. 1 is a circuit diagram illustrating a unit pixel of a complementary metal-oxide-semiconductor (CMOS) image sensor.

Referring to FIG. 1, the unit pixel 100 includes a photodiode PD, a pass transistor M1, a reset transistor M2, a conversion transistor M3, a selection transistor M4, and a capacitor C.

The photodiode PD generates a charge corresponding to the incident image signal. The pass transistor M1 performs a switching operation to pass or block the charge generated by the photodiode PD that is connected to a terminal of the pass transistor M1 to the other terminal thereof in response to a pass control signal PASS. A terminal of the capacitor C is connected to a ground voltage GND, and in the other terminal thereof, the charge passing through the pass transistor M1 that performs the switching operation is accumulated. The capacitor C illustrated in FIG. 1 is an electrical modeling of a floating diffusion area that is used as the other terminal of the pass transistor M1. The reset transistor M2 transmits a charge corresponding to a supply voltage VDD to the capacitor C in response to a reset control signal RESET. The conversion transistor M3 primarily determines an initial voltage value V1 that is determined by charges stored in the capacitor C through the reset transistor M2, and thereafter generates a conversion voltage value V2 corresponding to a voltage value that is changed because the charge generated by the photodiode PD affects the initial voltage value V1. The selection transistor M4 in the pixel outputs the initial voltage value V1 and the conversion voltage value V2 in response to a selection signal SEL.

The unit pixel illustrated in FIG. 1 is an example of conventional unit pixels, and operations of the pixel are well-known by those skilled in the art, so that a detailed description of the operations of the pixel is omitted.

A conversion efficiency of the pixel for converting an image signal into an electrical signal may be represented by a fill factor that is a ratio of the area occupied by the photodiode to the area of the pixel. In consideration of semiconductor manufacturing processes, the fill factor generally ranges from 20% to 45%. The pixel illustrated in FIG. 1 uses four transistors M1 to M4, and areas occupied by these four transistors in the pixel may cause a decrease in the area occupied by the photodiode. Recently, in order to reduce the number of MOS transistors, a method of sharing MOS transistors by adjacent pixels is proposed. Nonetheless, an area occupied by remaining MOS transistors is still large, so that an invention of a separate-type unit pixel is introduced (Korean Patent Application No. 10-2005-0030568, filed by LEE, Do-Young on Apr. 12, 2005).

According to the invention, a pass transistor M1 and a photodiode PD from among four MOS transistors, that are used to generate a charge corresponding to an image signal are manufactured in a wafer, and remaining transistors M2 and M4 that are used to convert the charge into a corresponding voltage so as to be output are manufactured in another wafer in order for the two wafers to be implemented as different chips. Thereafter, the chips are electrically connected to each other to be used. Since the pass transistor M1 and the photodiode that are used to generate the charge corresponding to the image signal are manufactured in a single wafer, an area of the photodiode can be increased, and the fill factor can be significantly improved. The details are disclosed in the above-mentioned Korean Patent Application.

FIG. 2 is a sectional view illustrating a semiconductor wafer of the separate-type unit pixel, in which the photodiode and the pass transistor are implemented, according to the invention.

Referring to FIG. 2, the photodiode PD includes a P-type diffusion area P and an N-type diffusion area N that are joined with each other. The pass transistor represented by a dotted circle is operated by the pass control signal PASS applied to a gate region G that is hatched, and a terminal of the pass transistor is a portion of the photodiode PD including the joined P-type diffusion area P and the N-type diffusion area N and the other terminal thereof is a floating diffusion area FD. The pass transistor in the dotted circle and the photodiode (PN junction region), included in a pixel, are surrounded by a shallow trench insulator (STI) structure. Therefore, electrons generated by the pixel to correspond to an incident image signal are prevented from being transited to an adjacent pixel. However, since a depth of the STI structure is not deep, a portion of the electrons generated by the photodiode may be transited to an adjacent pixel.

This phenomenon is called a cross talk. When the cross talk occurs, there is a problem in that when an electrical signal that is obtained by converting the incident image signal is reproduced, the original image signal is not correctly displayed.

DISCLOSURE OF INVENTION

Technical Problem

The present invention provides a pixel for picking up an image signal capable of suppressing an occurrence of a cross-talk.

The present invention also provides a method of manufacturing a pixel for picking up an image signal capable of suppressing an occurrence of a cross-talk.

Technical Solution

According to an aspect of the present invention, there is provided a pixel for picking up an image signal used as a pixel for picking up an image signal and generating a charge corresponding to the image signal. The pixel for picking up an image signal includes a substrate surrounded by a trench filled with an insulator, a photodiode, and the pass transistor. The photodiode is formed at an upper portion of the substrate and includes a P-type diffusion area and an N-type diffusion area which are joined with each other in a longitudinal direction. The pass transistor is formed at the upper portion of the substrate and includes the one terminal that is the joined P-type diffusion area and the N-type diffusion area, the other terminal that is a floating diffusion area, and a gate terminal disposed between the two terminals. The pixel for picking up an image signal is surrounded by the trench which penetrates the substrate from the upper portion to the lower portion of the substrate, and the trench is filled with an insulator.

According to another aspect of the present invention, there is provided a method of manufacturing the pixel for picking up an image signal including steps of: forming the photodiode, the floating diffusion area, and the gate terminal on an upper portion of a substrate; forming a trench area which completely surrounds the photodiode, the floating diffusion area, and the gate terminal into a first depth from the upper portion to the lower portion of the substrate; forming a portion of the trench area into a second depth deeper than the first depth; and filling an insulator in the trench area.

BRIEF DESCRIPTION OF THE DRAWINGS

FIG. 1 is a circuit diagram illustrating a unit pixel of a complementary metal-oxide-semiconductor (CMOS) image sensor.

FIG. 2 is a sectional view illustrating a semiconductor wafer of a separate-type unit pixel, in which a photodiode and a pass transistor are implemented, according to a related art.

FIG. 3 is a vertical sectional view illustrating a pixel for picking up an image signal according to the present invention.

FIG. 4 illustrates a connection relationship between two pixels for picking up an image signal according to the present invention.

FIG. 5 is a sectional view taken along line A-A' illustrated in FIG. 4.

FIG. 6 is a sectional view taken along line B-B' illustrated in FIG. 4.

FIG. 7 illustrates connection relationships between four pixels for picking up an image signal according to the present invention.

FIG. 8 illustrates connection relationships between four pixels for picking up an image signal according to the present invention.

BEST MODE FOR CARRYING OUT THE INVENTION

Hereinafter, exemplary embodiments of the present invention will be described in detail with reference to the attached drawings.

FIG. 3 is a vertical sectional view illustrating a pixel for picking up an image signal according to the present invention.

Referring to FIG. 3, the pixel 300 for picking up an image signal includes a photodiode PD, and pass transistor.

The photodiode PD is formed at a surface of the substrate SUB and includes a P-type diffusion area P and an N-type diffusion area N that are joined with each other in a longitudinal direction. The pass transistor is formed at the surface of the substrate SUB. A terminal of the pass transistor is the joined the N-type diffusion area N, and the other terminal thereof is a floating diffusion area FD. The pass transistor is controlled by a pass control signal PASS applied to a gate terminal (a hatched region). The gate terminal (the hatched region) may be made of polysilicon. The pixel for picking up an image signal is surrounded by a trench that penetrates the substrate from the upper portion to the lower portion of the substrate, and the trench is filled with an insulator. The trench is formed to be connected to the lower portion of the substrate, so that the pixel has a different structure from that of the conventional pixel illustrated in FIG. 2 in that the pixel can be completely isolated from adjacent pixels.

The pixel for picking up an image signal according to the present invention illustrated in FIG. 3 has an advantage in that a path through which charges generated by the photodiode are transmitted to an adjacent pixel is blocked, so that the crosstalk can be suppressed.

In FIG. 3, the trench is illustrated to be formed to penetrate the wafer from the upper portion to the lower portion of the substrate when the trench is firstly constructed. However, the construction of the trench for implementing the pixel for picking up an image signal as illustrated in FIG. 3 is obtained by grinding the lower surface of the wafer to expose a lower portion of the trench. A method of manufacturing the pixel for picking up an image signal having the aforementioned structure will be described later.

In general, a semiconductor circuit can be stably operated only when a stable bias voltage is applied to a substrate. Therefore, in the pixel of the picking up an image signal according to the present invention, a stable bias voltage has to be applied to the substrate.

According to a shape of the substrate, which one of the P-type diffusion area and the N-type diffusion area of the photodiode PD is to be disposed at an upper portion or a lower portion is determined. A type of the floating diffusion area FD is generally different from that of the substrate. For example, when the substrate is a P-type, the floating diffusion area FD is an N-type.

FIG. 4 illustrates a connection relationship between two pixels for picking up an image signal according to the present invention.

Referring to FIG. 4, a left pixel P1 for picking up an image signal and a right pixel P2 for picking up an image signal are connected to each other via a substrate bridge 401.

A section A-A' through the two pixels for picking up an image signal means a section that does not include the substrate bridge 401, and the other section B-B' means a section that includes the substrate bridge 401.

FIG. 5 is a sectional view taken along line A-A' illustrated in FIG. 4.

Referring to FIG. 5, the left pixel P1 for picking up an image signal is isolated from the right pixel P2 for picking up an image signal by a trench filled with the insulator.

FIG. 6 is a sectional view taken along line B-B' illustrated in FIG. 4.

Referring to FIG. 6, a portion of the left pixel P1 for picking up an image signal is isolated from the right pixel P2 for picking up an image signal by the trench filled with the insulator. However, the remaining portion thereof is electrically connected to the right pixel P2 by the substrate bridge 401.

Returning to FIG. 4, according to the present invention, most of the substrate region where the left pixel P1 for picking up an image signal is in contact with the right pixel P2 for picking up an image signal is isolated by the trench filled with the insulator, and a minimum region 401 is remained as a bridge, so that the pixels P1 and P2 are prevented from being electrically insulated from each other and the cross-talk is suppressed.

FIG. 7 illustrates connection relationships between four pixels for picking up an image signal according to the present invention.

Referring to FIG. 7, the four pixels P1 to P4 for picking up an image signal are electrically connected to each other by a substrate bridge (a hatched region) disposed at the center portion.

FIG. 8 illustrates connection relationships between four pixels for picking up an image signal according to the present invention.

Referring to FIG. 8, a diffusion area is formed at each of the four pixels P1 to P4 for picking up an image signal that are electrically isolated from each other, and a contact is formed at the diffusion area. The contacts are connected with each other through a metal line. In this case, the substrate bridge 401 does not exist in the trench that surrounds the pixels. Although not shown in FIG. 8, a bias voltage to be applied to the substrate is applied to a side of the metal line. Therefore, since the bias voltage has to be applied to the substrate region that is the base of the pixel, the contact and the metal line are needed.

Hereinafter, the method of manufacturing the pixels for picking up an image signal illustrated in FIGS. 4 to 7 according to the present invention, particularly in a semi-conductor manufacturing process will be described.

First, the photodiode, the floating diffusion area, and the gate terminal are formed at an upper portion of the substrate. A trench area that completely surrounds the photodiode, the floating diffusion area, and the gate terminal are primarily formed to have a first depth from the upper portion of the substrate to the lower portion thereof. Here, the first depth is used to define a region that is to be the substrate bridge. A portion of the trench area is secondarily formed to have a second depth deeper than the first depth. The secondarily formed trench with the second depth is used to electrically insulate the pixels from each other. The trenches that have difference depths are formed and filled with the insulator. Last, the lower portion of the substrate is ground. Here, the grinding operation is performed to expose the second depth. The sectional view of the pixel for picking up an image signal according to the present invention manufactured by the aforementioned operations is illustrated in FIG. 3.

The method of manufacturing the pixel for picking up an image signal is briefly described as follows.

First, the photodiode, the floating diffusion area, and the gate terminal are formed at the upper portion of the substrate.

Second, a trench area that completely surrounds the photodiode, the floating diffusion area, and the gate terminal are formed to have a first depth from the upper portion of the substrate to the lower portion thereof.

Third, a portion of the trench area is formed to have a second depth deeper than the first depth.

Fourth, the trench area is filled with the insulator.

Last, the lower portion of the substrate is ground to expose the second depth.

While the present invention has been particularly shown and described with reference to exemplary embodiments thereof, it will be understood by those skilled in the art that various changes in form and details may be made therein without departing from the spirit and scope of the present invention as defined by the appended claims.

Industrial Applicability

As described above, the pixel for picking up an image signal and the method of manufacturing the pixel for picking up an image signal according to the present invention prevent electrons generated by the image signal from being transited to an adjacent pixel. Therefore, an occurrence of a cross-talk can be suppressed.

The invention claimed is:

1. A pixel of an image sensor, said pixel comprising:
a photodiode having a P-type diffusion area and an N-type diffusion area that are joined in a longitudinal direction; and
a pass transistor having a first terminal that is the joined P-type diffusion area and the N-type diffusion area, a second terminal that is a floating diffusion area, and a gate terminal electrically connected to the first terminal and the second terminal,
wherein said photodiode and said pass transistor are formed on a substrate, which are surrounded by a plurality of trenches filled with an insulator, and wherein each of the trenches consists a substrate bridge formed at a first depth and an exposed region formed at a second depth of the substrate of which the substrate bridge provides an electrical connection to an adjacent pixel and the exposed region is used to electrically insulate the pixel from its adjacent pixel.

2. The pixel of claim 1, wherein positions of the P-type diffusion area and the N-type diffusion area of the photodiode are determined according to a shape of the substrate.

3. The pixel of claim 1, wherein a type of the floating diffusion area is different from that of the substrate.

4. The pixel of claim 1, wherein the gate terminal is made of polysilicon.

5. A method for manufacturing a pixel of an image sensor, comprising:
forming a photodiode and a pass transistor on an upper portion of a substrate, wherein the photodiode is made of a P-type diffusion area and an N-type diffusion area that are joined in a longitudinal direction, and wherein the pass transistor includes a first terminal that is the joined P-type diffusion area and the N-type diffusion area, a second terminal that is a floating diffusion area, and a gate terminal electrically connected to the first terminal and the second terminal;
forming a plurality of trenches to completely surrounds the substrate, wherein each trench consists a first region having a first depth and a second region having a second depth of which the second depth is deeper-than the first depth;
filling an insulator in the plurality of trenches; and
grinding the lower portion of the substrate to expose the second region, thereby forming a substrate bridge and exposed region in each of the trenches.

6. A pixel of an image sensor having a plurality of the pixels, each pixel comprising:
a photodiode having a P-type diffusion area and an N-type diffusion area that are joined in a longitudinal direction; and
a pass transistor having a first terminal that is the joined P-type diffusion area and the N-type diffusion area, a second terminal that is a floating diffusion area, and a gate terminal electrically connected to the first terminal and the second terminal,
wherein said photodiode and said pass transistor are formed on a substrate surrounded by a plurality of trenches that are filled with an insulator, and wherein said trenches penetrate through the entire depth of the substrate.

7. The pixel of claim 6, further comprising:
a diffusion area including an impurity having the same type as that of the substrate; and
a contact formed in the diffusion area, wherein the said pixel is electrically connected to its adjacent pixel via a metal line electrically connected to the diffusion area through the contact.

8. The pixel of claim 6, wherein positions of the P-type diffusion area and the N-type diffusion area of the photodiode are determined according to a shape of the substrate.

9. The pixel of claim 6, wherein a type of the floating diffusion area is different from that of the substrate.

10. The image sensor of claim 6, wherein the gate terminal is made of polysilicon.

* * * * *